April 12, 1960 W. A. ROTE ET AL 2,932,799
ELECTRICAL APPARATUS
Filed April 3, 1956
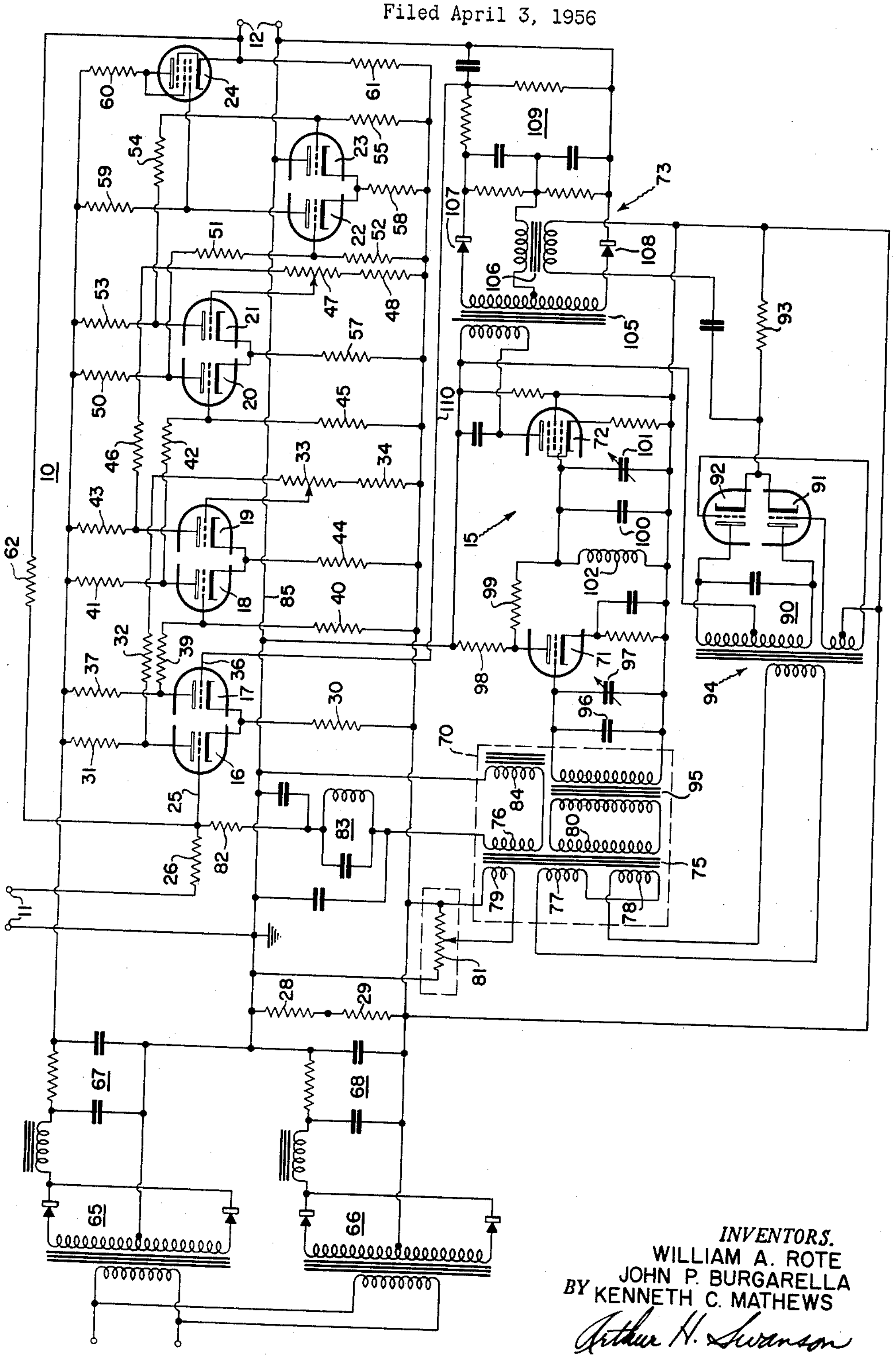
INVENTORS.
WILLIAM A. ROTE
JOHN P. BURGARELLA
BY KENNETH C. MATHEWS
Arthur H. Swanson
ATTORNEY.

2,932,799
Patented Apr. 12, 1960

1

2,932,799

ELECTRICAL APPARATUS

William A. Rote, Needham, Kenneth C. Mathews, Brookline, and John P. Burgarella, Gloucester, Mass., assignors to Minneapolis-Honeywell Regulator Company, Minneapolis, Minn., a corporation of Delaware Application April 3, 1956, Serial No. 575,782

10 Claims. (Cl. 330—10)

A general object of the present invention is to provide a new and improved direct current amplifier of the drift stabilized type. More specifically, the present invention is concerned with an improved drift stable amplifier which is characterized by its high gain, its high frequency response, and by the improved circuitry for eliminating the effects of drift or zero instability in the amplifier.

Drift stabilized amplifiers heretofore proposed in the prior art have been subject to certain inherent deficiencies as explained hereinafter. One known type comprises a high gain-direct current amplifier which is stabilized for gain, zero and drift by a combination of a feedback loop and a correction amplifier by means of which two signals are used to produce a low drift amplifier. Specifically, in such prior art arrangements, stabilization of the direct current amplifier for gain is accomplished by the use of a negative feedback circuit, and stabilization for zero and drift is accomplished by means including a mechanical contactor or circuit interrupter type modulator which transforms the direct current error voltage into a regularly varying voltage which may readily be amplified by an alternating current amplifier. The output of the alternating current amplifier is rectified by a synchronous rectifier and applied to the input of the direct current amplifier, being so polarized as to minimize the effects of drift in the direct current amplifier.

The use of a contacting or interrupting type of modulator in drift stabilized amplifiers of the prior art has been unsatisfactory due to the inherent tendency thereof to introduce undesirable effects which limit the usefulness and application of such amplifiers. Due to the high level of low frequency components of the contacting type of modulator and the inherent sensitivity of power frequency signals picked up on the line, the filtering problem in the correction loop amplifier is unduly complicated, particularly where the main direct current amplifier is intended to operate with a wide frequency response. In many applications of stabilized amplifiers of this type, drift in the contacting time of the contacting type modulator is effective to introduce oscillations and other objectionable effects. The elimination of these objectionable effects has required periodical manual adjustment of the modulator contacts. Another disadvantage resulting from the use of mechanical modulators in this type of amplifier is concerned with limitations of the frequency at which the modulator may be operated. This has resulted in further complication of the drift stabilizing problem in that the drift correction loop output must be well filtered if the modulating signal is to have no interfering effect. In other words, it is highly desirable that the carrier frequency of the modulator be as high as possible in order to achieve proper filtering before the correction loop signal enters the direct current amplifier. The speed at which the mechanical contacting type modulators may be operated and thereby the carrier frequency is sufficiently limited that considerable difficulty is encountered in achieving the necessary output filtering.

2

It is, therefore, a more specific object of the present invention to provide a new and improved stabilized direct current amplifier which is not subject to the foregoing deficiencies of the prior art stabilized amplifiers.

According to the present invention, an electro-magnetic modulator or converter is employed in the drift correction loop amplifier to convert the drift signal on the input of the associated direct current amplifier into an alternating current. The magnetic modulator preferably is operated at a relatively high frequency compared to the desired response frequency of the correction loop, which operating frequency is selected to be of such a value that it may readily be filtered by conventional filtering components to achieve the desired stabilization and correction. In this connection, it is noted that the use of a magnetic modulator in this arrangement requires less filtering than is necessary when a mechanical modulator is employed due to the fact that the output signal of the magnetic modulator in addition to having a higher carrier frequency than the mechanical contacting type is also free from the noise frequencies generated by mechanical contacting type modulators, and is also inherently stable with time so that periodical phasing adjustments are not necessary.

A further object of the present invention is to provide a new and improved zero stabilized direct current amplifier in which a magnetic modulator is employed in the input of the zero correction loop, with said modulator being energized at a frequency which is relatively high with respect to the desired response frequency of the correction loop. Typically, this output carrier frequency may be in the order of 10 kilocycles.

The various features of novelty which characterize this invention are pointed out with particularity in the claims annexed to and forming a part of this specification. For a better understanding of the invention, its advantages, and specific objects attained with its use, reference should be had to the accompanying drawings and descriptive matter in which there is illustrated and described a preferred embodiment of the invention.

Referring to the single figure of the drawing, the numeral 10 represents a direct current, differential amplifier of the type capable of amplifying input direct current signals which are applied to a pair of input terminals 11. The amplifier output terminals are designated by the terminals 12. A drift correction amplifier 15 is connected to the amplifier 10 to apply thereto a signal to eliminate the effects of any drift which may be present on the input of the amplifier sections of the direct current amplifier 10.

The direct current, differential amplifier 10, illustrated in the drawing and described hereinafter, is characterized by its freedom from undesirable effects tending to result from supply voltage changes, thus minimizing the need for regulated power supplies. That is to say, the differential amplifier 10 has been found to be less sensitive to supply voltage changes than so-called single-sided amplifiers.

Considering the amplifier 10 in greater detail, it will be noted that this amplifier comprises a plurality of electronic valves 16, 17, 18, 19, 20, 21, 22, 23, and 24 which may be of the vacuum tube type. The electronic valve 16 is the input valve for the direct current amplifier and has an input control electrode 25. A summing resistor 26 connects the electrode 25 to one of the input terminals 11. The other input terminal 11 is connected to the electronic valve 16 principally through the "B—" power supply, through a connection including series-connected resistors 28 and 29 and a cathode resistor 30. A plate resistor 31 serves as the output element for the electronic valve 16 and this output is connected by way of a coupling resistor 32 to a voltage divider formed by a potentiometer resistor 33 and a resistor 34 on the input of the electronic valve 19.

The electronic valve 17 has an input control electrode 36 and a plate load resistor 37. The output of the electronic valve 17 is coupled from the plate load resistor 37 through a coupling resistor 39 to the input of the electronic valve 18. A further resistor 40 is connected to the input of the valve 18 for biasing purposes. A common cathode resistor 44 serves as the cathode biasing means for the valves 18 and 19.

A plate load resistor 41 is connected in the output circuit of the electronic valve 18 and a coupling resistor 42 couples this plate resistor 41 to the input of the electronic valve 20. A resistor 45 serves as a bias resistor for the valve 20. Electronic valve 19 has a plate load resistor 43 and this resistor is coupled to the input of the electronic valve 21 by way of the coupling resistor 46 and the potentiometer resistor 47. A resistor 48 serves as the biasing resistor for the input of the valve 21.

Associated with electronic valve 20 is a plate load resistor 50 which is coupled by way of the coupling resistor 51 to the input of the electronic valve 22. In addition, a resistor 52 supplies a bias signal for the valve 22. The valve 21 is provided with a plate load resistor 53 which is coupled to the input of the electronic valve 23 by a coupling resistor 54. A biasing resistor 55 is connected to the input of the electronic valve 23. A resistor 57 serves as a cathode bias resistor for both of the electronic valves 20 and 21. A further resistor 58 serves as a common cathode bias resistor for the electronic valves 22 and 23. A plate resistor 59 is coupled to the plate of the electronic valve 22 and this plate resistor is also directly coupled to the input control electrode of the output electronic valve 24. Associated with the valve 24 is a plate resistor 60 and a cathode resistor 61.

Power is supplied to the direct current amplifier 10 by a pair of so-called full wave rectifier circuits 65 and 66. The output of the rectifier 65 is filtered by a filter section 67 while the output of the rectifier 66 is filtered by a filter section 68.

The correction loop amplifier 15 comprises a magnetic modulator 70, a pair of electronic valves 71 and 72, and a phase discriminator 73.

The magnetic modulator 70 is of the so-called second harmonic type and comprises a saturable core means 75 having wound thereon an input coil 76, a pair of oppositely wound exciting coils 77 and 78, a zeroing coil 79, and an output coil 80. The zeroing signal for the coil 79 is derived from a potentiometer 81 connected across the output of the filter section 68. The input signal for the input coil 76 is derived from the input signal on the control electrode 25 of the input valve 16 of the amplifier 10. This signal is coupled to the coil 76 by a resistor 82, and LC low pass filter network 83, to the coil 76, and through a choke coil 84 back to the grounded lead 85 of the amplifier 10.

The energizing signal for the exciting coils 77 and 78 is derived from an electronic oscillator 90, said oscillator including a pair of electronic valves 91 and 92 having a common cathode resistor 93 with a regenerative coupling and output transformer 94.

The magnetic modulator output coil 80 is coupled to the electronic valve 71 of the correction loop amplifier 15 by means of a coupling transformer 95. A pair of condensers 96 and 97 are connected in parallel with the output winding of the transformer 95 to form a parallel resonant circuit for the output signal from the magnetic converter and modulator 70. The output of the valve 71 includes a plate load resistor 98 and a coupling resistor 99, the latter of which is connected to a further parallel resonant circuit formed by the condensers 100 and 101 and the inductor 102. This last mentioned resonant circuit is connected to the input of the electronic valve 72. The output of the valve 72 is coupled by way of an output transformer 105 to the phase discriminators 73. The phase discriminator 73 includes a further input transformer 106, a pair of diodes 107 and 108, and an output filter network 109.

In considering the operation of the present invention, it should first be noted that the amplifier 10 is a direct current amplifier of the type capable of high gain. The input electrical signal applied to the input terminals 11 is coupled to the input of the valve 16 so that an electrical signal will appear on the control electrode 25 of the valve 16. The output of the valve 16 is coupled through resistor 32 to the potentiometer 33 and thereby to the input of the valve 19. The output of the valve 19 is coupled by way of the resistor 46 to the potentiometer 47, the latter of which is connected to the input of the valve 21. The output of the valve 21 is coupled by way of the resistor 54 to the input of the valve 23. The coupling between the valve 23 and the valve 22 is accomplished by means of the common cathode resistor 58. The output signal from the valve 22 is coupled directly into the input of the output valve 24. The output of the valve 24 is taken from the cathode thereof. It should be noted that the polarity of this output is opposite the polarity of the input signal applied to the control electrode 25 of the valve 16. In other words, if there is a positive signal appearing upon the control electrode 25 of the electronic valve 16, a negative signal will appear on the cathode of the electronic valve 24.

In order to stabilize this high gain amplifier 10, a feedback signal is coupled from the cathode of the valve 24 through resistor 62 to the input control electrode 25 of the valve 16. The effect of this feedback signal through the resistor 62 is to reduce the potential upon the control electrode 25 substantially to zero. In other words, the input signal on the terminals 11 applied to the input of the electronic valve 16 effectively is balanced by the feedback signal applied through the resistor 62.

As the direct current amplifier 10 is subject to a tendency to drift, there is a tendency for the amplifier output voltage to be some value other than zero when the input voltage is zero. Should such a drift condition exist in the amplifier 10, a drift signal will appear on the input of the valve 16. This drift signal is applied to the input coil 76 of the magnetic modulator 70 by way of the filter 83 and the choke 84. The effect of the input signal on the input of the magnetic modulator 70 is to produce an output alternating current signal of a phase and magnitude dependent on the polarity of the direct current drift signal applied to the input coil 76.

The magnetic modulator 70, as noted hereinbefore, is preferably of the second harmonic type. That is, with the oscillator 90 exciting the input coils 76 and 78 of the modulator 70 at a selected fundamental frequency, any flux unbalance in the core 75 due to the presence of a drift signal in the input coil 76 will result in the production of an alternating signal in the modulator output winding 80, which alternating signal will have a frequency equal to the second harmonic of said fundamental oscillator frequency. The phase of this second harmonic signal will depend upon the polarity of the drift signal on the input of the electronic valve 16. Its magnitude will be proportional to the magnitude of the drift signal. A magnetic modulator of this second harmonic type is particularly suitable for use in the apparatus arrangement described in that it provides both voltage and power gain insofar as the input signal is concerned. Thus, fewer stages of voltage amplification are required in the drift correction amplifier 15.

The output signal from the modulator 70 is coupled to the amplifying valve 71 through the transformer 95 the secondary of which cooperates with the condensers 96 and 97 to form a parallel resonant circuit at the selected second harmonic frequency. The signal on the input of the valve 71 is coupled by way of the coupling resistor 99 to the input of the valve 72 where the signal further is amplified. The output of the valve 72 is coupled by way of the transformer 105 to the phase discriminator 73.

The transformer 106 of the phase discriminator 73 receives an energizing signal from the cathode resistor of the oscillator 90. The signal appearing across the resistor 93 is predominantly a second harmonic signal of the selected fundamental frequency of the oscillator and this second harmonic signal is utilized as a reference for the signal applied to the phase discriminator by the input transformer 105.

The output of the phase discriminator 73 is a direct current the polarity and amplitude of which are a function of the phase and amplitude of the signal applied to the phase discriminator by the transformer 105. This direct current signal is filtered by the filter 109 and applied by way of conductor 110 back to the input control electrode 36 of the valve 17. The signal on the control electrode 36 is amplified by the valve 17 and is applied by way of the coupling resistor 39 to the input of the valve 18. The output of the valve 18 is coupled by way of the coupling resistor 42 to the input of the valve 20 while the output of this latter valve is coupled by way of the resistor 51 to the input of the valve 22. As pointed out above, the valve 22 is coupled at its output directly to the input control electrode of the valve 24. Inasmuch as the drift correction signal originating from the output of the filter 109 is added to the electrical signal applied to the input of the valve 22 by means of common cathode resistor 58, the effect of the drift signal present in the amplifier is eliminated so that when there is a zero input signal on the input terminals 11, there will be a zero output signal on the output terminals 12 of amplifier 10.

The drift correction amplifier 15 continuously monitors the input of the electronic valve 16 of amplifier 10 and continuously makes corrections for the elimination of any drift signal which tends to occur on the input of the valve 16. In the preferred embodiment of the invention, the frequency response of the correction loop amplifier sections 15 was selected to be approximately one-fourth (¼th) of a cycle per second. In an operative embodiment of the invention, the fundamental frequency for the excitation of the magnetic modulator 70 was selected to be approximately 5,000 cycles per second. With this arrangement, a drift signal applied to the modulator 70 would be modulated on the output coil 80 at double the fundamental excitation frequency or 10,000 cycles per second. This 10,000 cycle signal is amplified and applied to the phase discriminator 73 in which the modulating frequency is eliminated. With such a high modulating frequency, it is possible readily to filter the output of the phase discriminator 73 by the use of simple RC filtering components in the filter 109. Such wide separation between the modulating frequency and the maximum frequency response to the amplifier insures that the modulating frequency will be effectively filtered out without introducing any undesirable effects in the direct current amplifier 10 when the signal is coupled thereto to correct for drift present which may tend to exist in the amplifier. While the above form of amplifier provides a signal separation by a factor of 40,000 between correction amplifier response frequency and modulator output carrier frequency, this may be lowered but is preferably maintained with at least a 10,000 per second difference.

Another advantage of the particular drift correction loop in this form of amplifier results from the fact that the output second harmonic signal from the modulator output coil 80 is of constant phase and stable with time. Moreover, the output is not affected by line frequency pickup or mechanical disturbances. Consequently there is less need for especial filtering and shielding to eliminate the presence of noise encountered with mechanical contacting type modulators.

While the foregoing principles of the present invention have been shown applied to a vacuum tube type circuit, it will be readily apparent that the principles are equally applicable to transistors and other types of amplifying elements wherein it is essential that any drift in the overall combination be eliminated.

While, in accordance with the provisions of the statutes, there has been illustrated and described the best forms of the embodiments of the invention known, it will be apparent to those skilled in the art that changes may be made in the forms of the apparatus disclosed without departing from the spirit of the invention as set forth in the appended claims, and that in some cases certain features of the invention may be used to advantage without a corresponding use of other features.

Having now described the invention, what is claimed as new and for which it is desired to secure by Letters Patent is:

1. In an electrical signal amplifier comprising a direct current amplifier having a pair of input terminals and a pair of output terminals, a feedback connection from said output terminals to said input terminals to produce on said input terminals a substantially zero input signal, and a drift correction amplifier connected to said pair of input terminals and having an output connected to an input of said direct current amplifier to provide zero stability for said direct current amplifier, the improvement wherein said drift correction amplifier comprises a mechanically static magnetic converter having an input coil energized by a drift signal tending to be present on said pair of input termials and providing an output alternating current signal of reversible phase dependent on the polarity of the drift signal on said pair of input terminals, an alternating current amplifier connected to the output of said converter, and a phase discriminator connected to the output of said alternating current amplifier and providing a direct current output proportional to the drift signal present on said pair of input terminals.

2. In an electrical signal amplifier comprising a direct current amplifier having a pair of input terminals and a pair of output terminals, a feedback connection from said output terminals to said input terminals to produce on said input terminals a substantially zero input signal, and a drift correction amplifier connected to said pair of input terminals and having an output connected to an input of said direct current amplifier to provide zero stability for said direct current amplifier, the improvement wherein said drift correction amplifier comprises a magnetic converter having an input coil energized by the electrical drift signal present on said pair of input terminals, an oscillator having a first and a second output, means coupling said first output of said oscillator to said magnetic converter so that said converter will have an output alternating current whose phase is dependent upon the polarity of the signal on said pair of input terminals, an alternating current amplifier connected to said converter, a phase discriminator having a first input connected to the output of said alternating current amplifier and having a second input connected to said second output of said oscillator, said phase discriminator having a direct current output proportional to the drift signal present on said pair of input terminals.

3. In an electrical signal amplifier comprising a direct current amplifier having a pair of input terminals and a pair of output terminals, a feedback connection from said output terminals to said input terminals to produce on said input terminals a substantially zero input signal, and a drift correction amplifier connected to said pair of input terminals and having an output connected to an input of said direct current amplifier to provide zero stability for said direct current amplifier, the improvement wherein said drift correction amplifier comprises an alternating current energized mechanically static magnetic converter producing a second harmonic frequency of the applied alternating current with the phase of the second harmonic being dependent upon the energization of an input coil energized by the electrical drift signal present on said pair of input terminals, an alternating current amplifier connected to said converter to amplify said second harmonic frequency, a phase discriminator connected to the output of said alternating current amplifier and having a direct current output proportional to the drift signal present on said pair of input terminals.

4. In electrical apparatus for amplifying a direct current signal and variations thereof comprising a direct current amplifier having a pair of input terminals and a pair of output terminals, a negative feedback connection from said output terminals to said input terminals to reduce the net signal on said input terminals to substantially zero, and a drift correction amplifier having an input connected to said pair of input terminals and an output connected to an input of said direct current amplifier to eliminate the effects of any drifting of the signal on said pair of input terminals from zero, the improvement wherein said drift correction amplifier comprises a mechanically static magnetic D.C. to A.C. converter whose output signal frequency is of variable phase and at least 10,000 times higher than the drift correction response signal, and a phase discriminator connected to said converter and having a drift counteracting direct current signal on the output thereof.

5. Apparatus as defined in claim 4 wherein said magnetic D.C. to A.C. converter is energized by an electrical oscillator whose frequency is at least 5,000 times as high as the response frequency of said drift correction amplifier and said phase discriminator has an input connected to said oscillator.

6. In a drift stabilized direct current amplifier comprising a plurality of direct current amplifier stages, said amplifier having a pair of input terminals and a pair of output terminals, a negative feedback circuit connected between said pair of output terminals and said pair of input terminals, the improvement comprising a mechanically static magnetic converter connected to said pair of input terminals, said magnetic converter modulating any drift signal present on said pair of input terminals, means connected to said converter to rectify said modulated signal, and means connecting the output of said last named means to an input of said direct current amplifier to eliminate drift on said pair of input terminals.

7. In a drift stabilized direct current amplifier comprising a plurality of direct current amplifier stages, said amplifier having a pair of input terminals and a pair of output terminals, a negative feedback circuit connected between said pair of output terminals and said pair of input terminals to reduce the potential on said input terminals to substantially zero, a low pass filter connected to said pair of input terminals and being arranged to pass any direct current drift signal present on said pair of input terminals, the improvement comprising a magnetic converter connected to the output of said low pass filter for modulating any drift signal passed by said filter, a phase discriminator connected to the output of said magentic converter to produce a drift correcting direct current signal, an oscillator having an output signal coupled to said magnetic converter to supply the modulating signal thereto and an output signal connected to said phase discriminator, a second low pass filter connected between said phase discriminator and an input of said direct current amplifier, said second low pass filter shunting the signal originating from said oscillator and passing the drift correcting signal to eliminate drift on said pair of input terminals.

8. In a direct current amplifier having an input circuit and an output circuit, an inverse feedback circuit connecting said circuits, the improvement comprising mechanically static magnetic modulating means having an input coil coupled to said input circuit to convert direct current voltage obtained at said input circuit to alernating voltage, an alternating current amplifier connected to said modulating means to amplify said alternating voltage, a rectifier connected to said alternating current amplifier to convert amplified alternating voltage output obtained from said alternating current amplifier to direct current voltage, a second input circuit for said direct current amplifier, and connections to apply direct current voltage from said rectifier to said second input circuit to develop in said output circuit a direct current voltage of polarity opposite to that of said first mentioned direct current voltage.

9. In a direct current amplifier having an output circuit and having an input stage including a twin-triode having a common cathode connection, means including a summing resistor to apply a direct current voltage to the grid of the first of said triodes, means coupling said twin-triode to said output circuit, a feedback connection between said output circuit and the grid of the first of said triodes, the improvement comprising mechanically static magnetic modulating means having an input coil coupled to the grid of the first of said triodes to generate an alternating voltage proportional to the direct current voltage at the grid of said first triode, an alternating current amplifier coupled to said modulating means to amplify said alternating voltage, and means including a rectifier and filter for applying to the grid of the second of said triodes a stabilizing direct current voltage such that the input and output voltages of said direct current amplifier are zero at the same time.

10. In a direct current amplifier having an output circuit and having an input stage including first and second inputs respectively associated with first and second outputs, a pair of input terminals on which a direct current voltage to be amplified is adapted to be applied, a summing resistor connecting said input terminals to one of said inputs, means coupling said first and second outputs of said input stage to said output circuit, a feedback connection between said output circuit and the said first input of said input stage, the improvement comprising mechanically static magnetic modulating means having an input coil coupled to the said first input of said input stage to generate an alternating voltage proportional to the direct current voltage applied to said input, and means including a rectifier and filter to amplify and rectify said alternating voltage, and means connecting the output of said last mentioned means to the said second input of said input stage.

References Cited in the file of this patent

UNITED STATES PATENTS

| | | |
|---|---|---|
| 2,619,552 | Kerns | Nov. 25, 1952 |
| 2,684,999 | Goldberg et al. | July 27, 1954 |
| 2,685,000 | Vance | July 27, 1954 |
| 2,741,668 | Iffland | Apr. 10, 1956 |
| 2,744,168 | Gilbert | May 1, 1956 |